(12) United States Patent
Kwak et al.

(10) Patent No.: US 8,030,838 B2
(45) Date of Patent: Oct. 4, 2011

(54) ORGANIC LIGHT EMITTING DISPLAY APPARATUS

(75) Inventors: Won-Kyu Kwak, Suwon-si (KR); Yong-Seog Kim, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 281 days.

(21) Appl. No.: 12/288,938

(22) Filed: Oct. 23, 2008

(65) Prior Publication Data

US 2009/0128023 A1 May 21, 2009

(30) Foreign Application Priority Data

Nov. 16, 2007 (KR) .................. 10-2007-0117368

(51) Int. Cl.
*H01L 51/52* (2006.01)
*H01L 51/50* (2006.01)

(52) U.S. Cl. ........ 313/503; 313/500; 313/504; 313/509; 313/506

(58) Field of Classification Search ............ 313/500–512
See application file for complete search history.

(56) References Cited

U.S. PATENT DOCUMENTS

| 7,279,708 | B2 * | 10/2007 | Kwak et al. ............... 257/72 |
| 2004/0195964 | A1 * | 10/2004 | Yamazaki et al. ........... 313/504 |
| 2005/0008894 | A1 | 1/2005 | Hiruma et al. |
| 2006/0113900 | A1 | 6/2006 | Oh |
| 2007/0007554 | A1 | 1/2007 | Lee |
| 2009/0058280 | A1 * | 3/2009 | Jo et al. .................. 313/504 |

FOREIGN PATENT DOCUMENTS

| EP | 1 513 196 A | 3/2005 |
| KR | 10-2005-0113517 A | 12/2005 |
| KR | 10-2006-0059722 A | 6/2006 |
| KR | 10-2006-0067049 A | 6/2006 |
| KR | 10-2007-0035884 A | 4/2007 |

OTHER PUBLICATIONS

Notice of Allowance issued on Nov. 29, 2008 in Korean Publication No. 10-2007-0117368.
Extended European Search Report for EP 08169186.7 dated Mar. 9, 2009.

* cited by examiner

*Primary Examiner* — Mariceli Santiago
(74) *Attorney, Agent, or Firm* — Knobbe Martens Olson & Bear LLP

(57) ABSTRACT

An organic light emitting display apparatus that can prevent corrosion during manufacturing is disclosed. The apparatus can have a remarkably enhanced yield. The apparatus includes: a substrate having a display area, a thin film transistor disposed inside the display area, an electrode power supply line disposed outside the display area, a pixel electrode disposed inside the display area of the substrate and electrically connected to the thin film transistor, an auxiliary conductive layer contacting the electrode power supply line at a side of the electrode power supply line, a pixel defining layer exposing the pixel electrode covering the auxiliary conductive layer and exposing the electrode power supply line. The apparatus also includes an intermediate layer disposed on the pixel electrode and comprising an emitting layer, and a counter electrode disposed on the intermediate layer and extending outside the display area of the substrate to contact the electrode power supply line.

19 Claims, 5 Drawing Sheets

US 8,030,838 B2

ORGANIC LIGHT EMITTING DISPLAY APPARATUS

CROSS-REFERENCE TO RELATED PATENT APPLICATION

This application claims the benefit of Korean Patent Application No. 10-2007-00117368, filed on Nov. 16, 2007, in the Korean Intellectual Property Office, the disclosure of which is incorporated herein in its entirety by reference.

BACKGROUND

1. Field

The present invention relates to an organic light emitting display apparatus, and more particularly, to an organic light emitting display apparatus that resists corrosion during a manufacturing process thereof, and the organic light emitting display apparatus can have a remarkably increased yield.

2. Description of the Related Technology

Generally, organic light emitting display apparatuses refer to display apparatuses including organic light emitting devices. The organic light emitting devices include a pixel electrode, a counter electrode disposed opposite the pixel electrode, and an intermediate layer interposed between the pixel electrode and the counter electrode and including a light emitting layer.

An organic light emitting display apparatus can be classified as an active matrix display or a passive matrix display according to a driving method of the organic light emitting devices. In an active matrix display apparatus, a thin film transistor (TFT) of each of a plurality of sub-pixels controls the emission of light from the sub-pixel. In a passive matrix display apparatus, a plurality of electrodes arranged in a matrix shape controls the emission of light from a plurality of sub-pixels. In the case of the active matrix display apparatus, counter electrodes of a plurality of sub-pixels are generally formed as one body and contact an electrode power supply line positioned outside a display area.

The electrode power supply line is covered by an insulating layer that exposes at least a part of the electrode power supply line. The counter electrode contacts the exposed part of the electrode power supply line. However, before forming the counter electrode to contact the electrode power supply line during the manufacturing thereof, a process of exposing a part of the electrode power supply line outside the insulating layer is performed. Thus, the surface of the electrode power supply line is oxidized during the exposing process. As a result, contact resistance is increased in the subsequently-formed structure in which the electrode power supply line contacts with counter electrode.

SUMMARY OF CERTAIN INVENTIVE ASPECTS

One aspect is an organic light emitting display apparatus including a substrate having a display area, a thin film transistor (TFT) disposed inside the display area of the substrate, an electrode power supply line disposed outside the display area of the substrate, a pixel electrode disposed inside the display area of the substrate and electrically connected to the thin film transistor, an auxiliary conductive layer contacting the electrode power supply line, a pixel defining layer exposing the pixel electrode, covering the auxiliary conductive layer, and exposing the electrode power supply line, an intermediate layer disposed on the pixel electrode and including an emitting layer, and a counter electrode disposed on the intermediate layer and extending outside the display area of the substrate to contact the electrode power supply line.

Another aspect is an organic light emitting display apparatus, including a substrate, a conductive layer disposed on the substrate, an insulating layer covering a portion of the conductive layer so as to expose another portion of the conductive layer, and a terminal unit extending from the conductive layer toward an edge of the substrate, where the terminal unit and the conductive layer that is exposed by the insulating layer are formed of the same material.

BRIEF DESCRIPTION OF THE DRAWINGS

The above and other features and advantages will become more apparent through description of exemplary embodiments with reference to the attached drawings in which.

DETAILED DESCRIPTION OF CERTAIN INVENTIVE EMBODIMENTS

Embodiments will now be described in detail with reference to the attached drawings.

Figure 1:
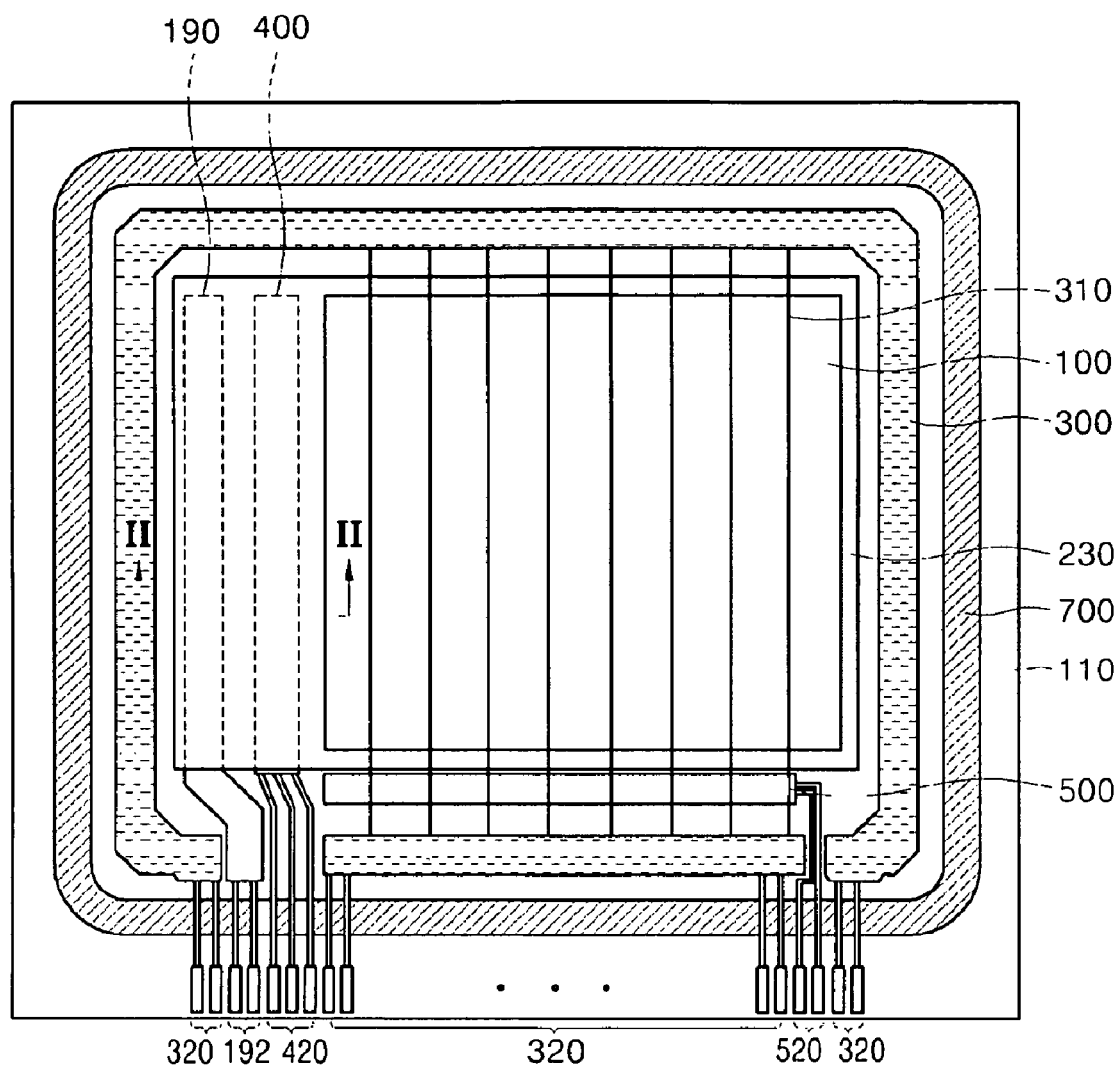
FIG. 1 is a schematic plan view of an organic light emitting display apparatus according to an embodiment.
Figure 2:
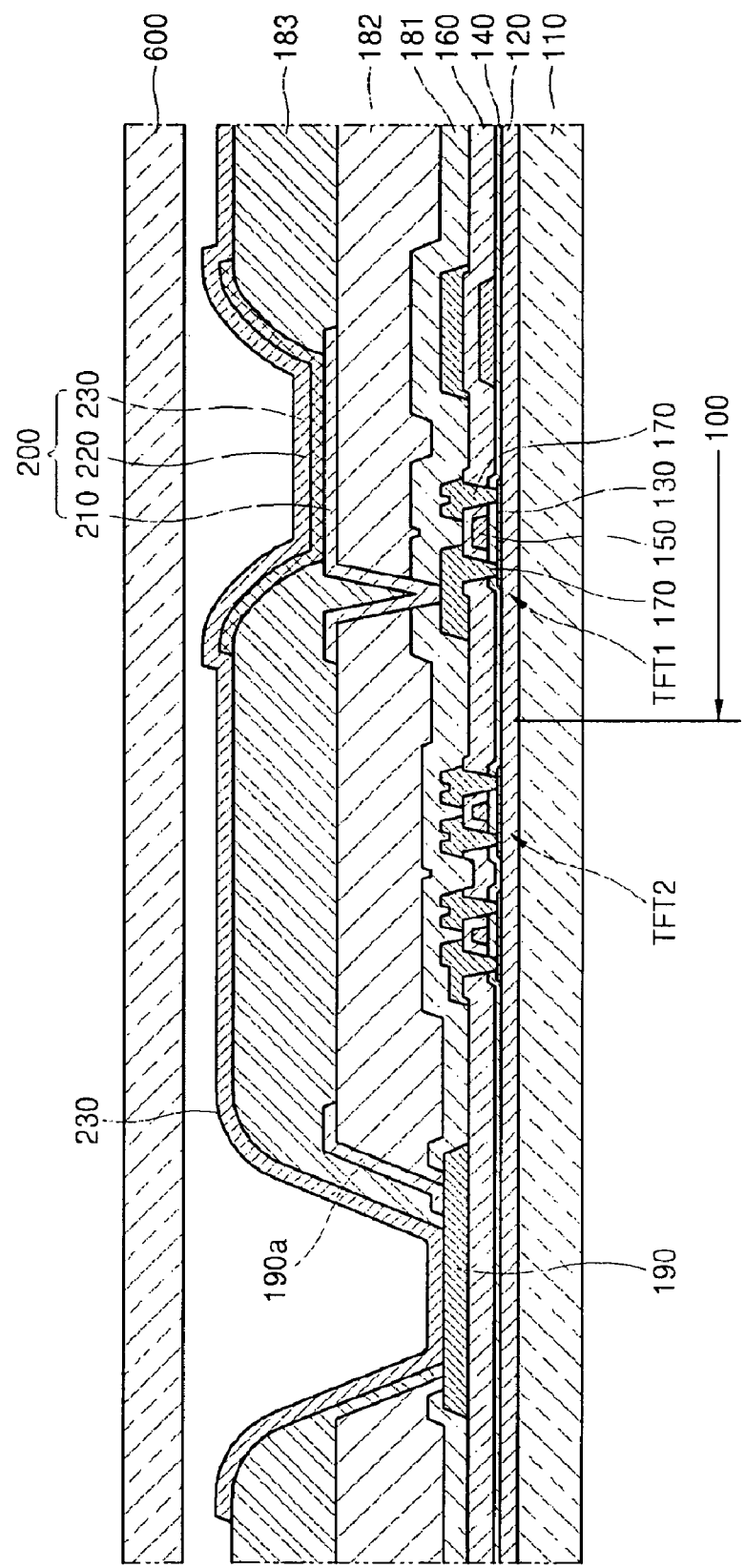
FIG. 2 is a schematic cross-sectional view taken along line II-II of FIG. 1, according to an embodiment.
Figure 3:
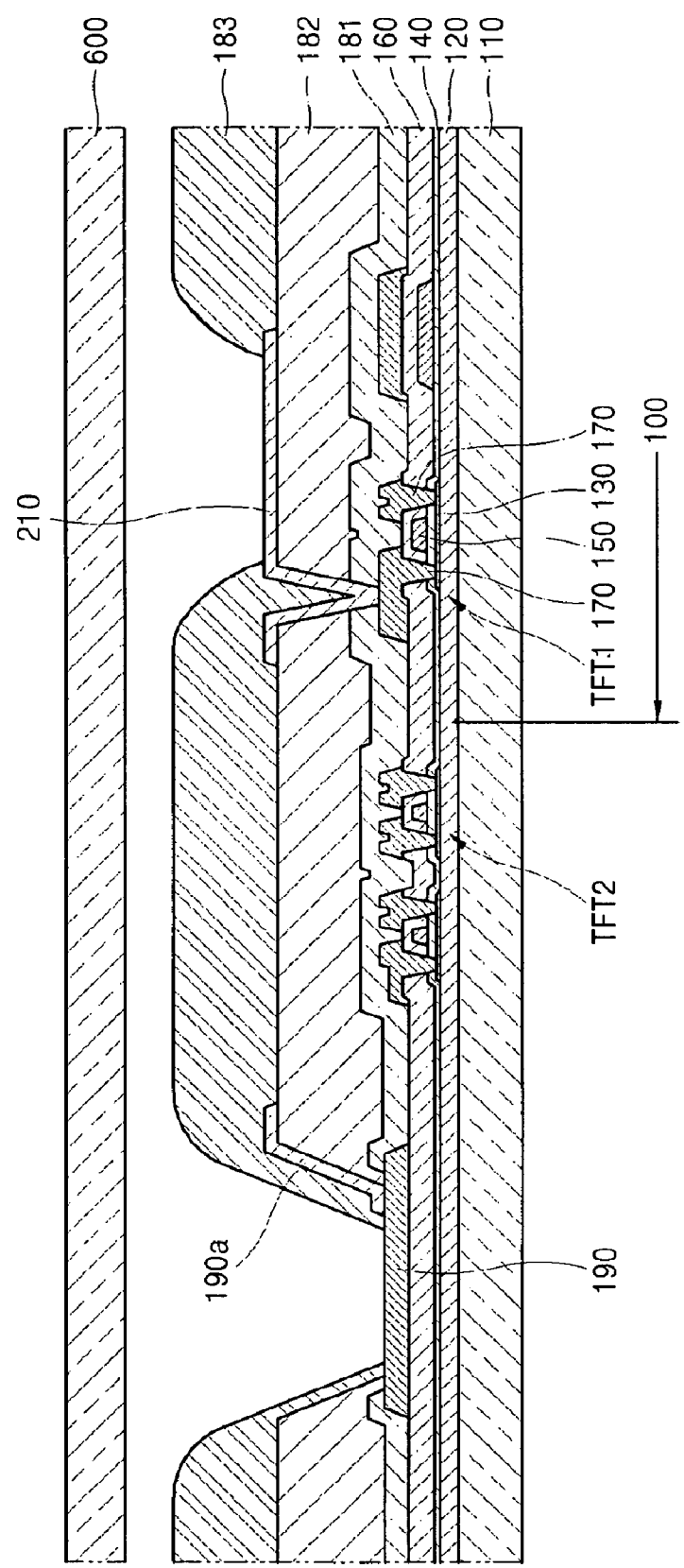
FIG. 3 is a schematic cross-sectional view for describing a process of manufacturing the organic light emitting display apparatus of FIG. 2, according to an embodiment.

FIG. 1 is a schematic plan view of an organic light emitting display apparatus according to an embodiment. FIG. 2 is a schematic cross-sectional view taken along line II-II of FIG. 1, according to an embodiment. FIG. 3 is a schematic cross-sectional view for describing a process of manufacturing the organic light emitting display apparatus.

Referring to FIGS. 1 through 3, the organic light emitting display apparatus shown includes a substrate 110. The substrate 110 may be formed of various materials such as glass, a metal, plastic or the like. The substrate 110 has a display area 100 where display devices are disposed for displaying images. The display area 100 includes an organic light emitting device 200 including a pixel electrode 210 (see FIG. 2), a counter electrode 230 (see FIG. 2) disposed opposite the pixel electrode 210, and an intermediate layer 220 including at least an emitting layer interposed between the pixel electrode 210 and the counter electrode 230.

In addition to the organic light emitting device 200 of the display area 100, a vertical circuit driving unit 400 and a horizontal circuit driving unit 500 that are disposed outside the display area 100, a power wiring unit 300 to which a plurality of power supply lines 310 supplying power to the display area 100 are electrically connected, an electrode power supply line 190 supplying power to the counter electrode 230, and terminal units 192, 320, 420, and 520 transmitting electrical signals applied to the above components from external devices are formed on the substrate 100. A sealant 700 may be applied on edges of the substrate 110, so that a sealing element 600 (see FIG. 2) seals the display area 100. Alternatively, the sealant 700 and the sealing element 600 may not be formed, or a passivation layer may be formed on the entire surface of the substrate 110. The terminal units 192, 320, 420, and 520 are not covered and are exposed by spaces in insulating layers to be described later so as to be connected to other electrical components such as a flexible printing circuit substrate, an IC chip, or the like.

Structures of the display area 100 and the organic light emitting device 200 will now be described in detail with reference to FIG. 2.

A first thin film transistor TFT1 is disposed in the display area 100 on the substrate 110. The electrode power supply line 190 is disposed outside the display area 100 on the substrate 110. A second TFT TFT2 included in the vertical circuit driving unit 400 may be disposed outside the display area 100 on the substrate 110. The structure and components of the organic light emitting device 200 will now be described in more detail.

A buffer layer 120, which may be formed of $SiO_2$, etc., is disposed on the substrate 110. A semiconductor layer 130 is disposed on the buffer layer 120. The semiconductor layer 130 may be an amorphous silicon layer, a polycrystalline silicon layer, or formed of an organic semiconductor material. Although not shown in FIG. 2, the semiconductor layer 130 may include source and drain areas doped with a dopant and a channel area.

A gate electrode 150 is formed above the semiconductor layer 130, and source and drain electrodes 170 electrically communicate with each other according to a signal applied to the gate electrode 150. The gate electrode 150 may be formed of a material such as MoW, Ag, Cu, Al, or the like, in consideration of, for example, adherence to an adjacent layer, planarizing, and machining of a surface of a layer stacked on the gate electrode 150. In the some embodiments, a gate insulating layer 140 formed of $SiO_2$ is interposed between the semiconductor layer 130 and the gate electrode 150 in order to provide insulation between the semiconductor layer 130 and the gate electrode 150.

An interlayer insulating layer 160 is formed on the gate electrode 150 and may be formed of a material such as silicon oxide, silicon nitride, or the like as a single layer or a multi-layer structure. The source and drain electrodes 170 are formed on the interlayer insulating layer 160. The source and drain electrodes 170 are electrically connected to the semiconductor layer 130 through contact holes which are formed in the interlayer insulating layer 160 and the gate insulating layer 140, respectively. The source and drain electrodes 170 may be formed of a material such as Ti, MoW, Ag, Cu, Al, or the like in consideration of conductivity. The source and drain electrodes 170 may be formed as a single layer or a multi-layer structure and, for example, may have a structure in which a Ti layer and an Al layer are stacked.

The electrode power supply line 190 is disposed outside the display area 100. Referring to FIG. 2, the electrode power supply line 190 is disposed on the interlayer insulating layer 160 on which the source and drain electrodes 170 of the first TFT TFT1 are disposed. That is, the electrode power supply line 190 may be simultaneously formed together with the source and drain electrodes 170 of the first TFT TFT1. However, the present invention is not limited thereto. That is, the electrode power supply line 190 may be formed on a layer on which the gate electrode 150 of the first TFT TFT1 is formed or may be formed irrespective of positions of electrodes of the first TFT TFT1. For convenience of explanation, however, the electrode power supply line 190 is formed on the interlayer insulating layer 160 on which the source and drain electrodes 170 are disposed.

The electrode power supply line 190 may be formed of various materials. The electrode power supply line 190 supplies an electrical signal to the counter electrode 230 of the organic light emitting device 200 as will be described later and thus is formed of a material having low resistivity and high conductivity such as Ti, MoW, Ag, Cu, Al or the like. The electrode power supply line 190 may be formed as a single layer or a multi-layer structure and, for example, may have a structure in which a Ti layer and an Al layer are stacked. As described above, the source and drain electrodes 170 and the electrode power supply line 190 may be formed of the same material or may be simultaneously formed together. When the source and drain electrodes 170 and the electrode power supply line 190 are simultaneously formed together, the source and drain electrodes 170 and the electrode power supply line 190 may have the same structure.

The electrode power supply line 190 supplies power to the counter electrode 230 as will be described later. The terminal unit 192 is extended from the electrode power supply line 190 toward an edge of the substrate 110. Power is supplied to the electrode power supply line 190 through the terminal unit 192 and is supplied to the counter electrode 230 through the electrode power supply line 190. The terminal unit 192 and the electrode power supply line 190 may be simultaneously formed together, and accordingly, may be formed of the same material. When the terminal unit 192 and the electrode power supply line 190 are simultaneously formed together, structures thereof are the same or similar. In some embodiments, the terminal unit 192 and/or the electrode power supply line 190 may include a layer formed of Al in consideration of conductivity.

A first insulating layer 181 is formed above the first TFT TFT1 to operate as a passivation layer so as to protect the first TFT TFT1. The first insulating layer 181 may be formed of various materials, i.e., an inorganic material, such as silicon oxide, silicon nitride, or silicon oxynitride, which can provide a high level of protection for the first TFT TFT1. The first insulating layer 181 is formed as a single layer in FIG. 2; however, the it is not limited thereto and the first insulating layer 181 may be formed as a multi-layer structure. The first insulating layer 181 is formed so as to expose at least a part of the electrode power supply line 190. FIG. 2 illustrates a structure in which the first insulating layer 181 covers edge portions of the electrode power supply line 190.

A second insulating layer 182 functions as a planarizing layer on the first insulating layer 181. The second insulating layer 182 may be formed of an organic material, e.g., acryl, BCB, photoacryl, or the like. The second insulating layer 182 is illustrated as a single layer in FIG. 2. However, the it is not limited thereto and the second insulating layer 182 may be formed as a multi-layer structure. The second insulating layer 182 is formed so as to expose at least a part of the electrode power supply line 190.

The organic light emitting device 200 is disposed on the second insulating layer 182 and includes the pixel electrode 210, the counter electrode 230, and the intermediate layer 220 interposed between the pixel electrode 210 and the counter electrode 230. The organic light emitting device 200 will now be described in detail.

In the display area 100, openings are formed in the first and second insulating layers 181 and 182 to expose at least one of the source and drain electrodes 170 of the first TFT TFT1. The pixel electrode 210 is disposed on the display area 100 of the substrate 110, i.e., on the second insulating layer 182 and contacts at least one of the source and drain electrodes 170 through the openings so as to be electrically connected to the first TFT TFT1. The pixel electrode 210 may be a transparent electrode or a reflective electrode. If the pixel electrode 210 is a transparent electrode, the pixel electrode 210 may be formed of, for example, indium tin oxide (ITO), indium zinc oxide (IZO), ZnO, or $In_2O_3$. If the pixel electrode 210 is a reflective electrode, the pixel electrode 210 may, for example include a reflective layer formed of Ag, Mg, Al, Pt, Pd, Au, Ni, Nd, Ir, Cr, or a combination thereof, and a layer formed of ITO, IZO, ZnO, or $In_2O_3$. However, the pixel electrode 210 is not limited thereto, and the pixel electrode 210 may be formed of various materials, and also, may be formed as a single layer or a multi-layer structure.

A third insulating layer 183 is disposed on the second insulating layer 182. In other words, the third insulating layer 183 is formed so as to cover the second insulating layer 182. The third insulating layer 183 operates as a pixel defining layer by having openings corresponding to a plurality of sub-pixels, which expose at least a part of the pixel electrode 210. For example, a central portion or the whole portion of the pixel electrode 210 may be exposed. Referring to FIG. 2, the third insulating layer 183 increases a distance between the end of the pixel electrode 210 and the counter electrode 230. This is beneficial in preventing arcing between the pixel electrode 210 and the counter electrode 230. The third insulating layer 183 is disposed on the second insulating layer 182, and also may be disposed outside the display area 100 as illustrated in FIG. 2. That is, the third insulating layer 183 may be disposed both over and outside the display area 100 of the substrate 110. Also, the third insulating layer 183 of FIG. 2 exposes at least a part of the electrode power supply line 190.

An auxiliary conductive layer 190*a* is disposed so as to contact the electrode power supply line 190 at a side of the electrode power supply line 190. The auxiliary conductive layer 190*a* contacts the electrode power supply line 190 so as to establish a lower conductive path and reduce IR drop through the electrode power supply line 190. The auxiliary conductive layer 190*a* may be disposed outside the display area 100 of the substrate 110. Referring to FIG. 2, a part of the auxiliary conductive layer 190*a* may be disposed on the same layer on which the pixel electrode 210 is disposed. In FIG. 2, the auxiliary conductive layer 190*a* is disposed on the second insulating layer 182 and the electrode power supply line 190. In this case, the auxiliary conductive layer 190*a* may be formed of the same material as that of the pixel electrode 210. The auxiliary conductive layer 190*a* and the pixel electrode 210 may be simultaneously formed together. In this case, the auxiliary conductive layer 190*a* and the pixel electrode 210 may have the same structure. The auxiliary conductive layer 190*a* is covered by the third insulating layer 183, and accordingly, the auxiliary conductive layer 190*a* is not exposed outside the third insulating layer 183.

The intermediate layer 220 of the organic light emitting device 200 may be formed of a low or high molecular weight material. When the intermediate layer 220 is formed of a low molecular weight material, it may be preferable to have at least one of a hole injection layer (HIL), a hole transport layer (HTL), an emission layer (EML), an electron transport layer (ETL), an electron injection layer (EIL), and the like stacked in a single structure or a multi-layer structure to form the intermediate layer 220. Alternatively, the intermediate layer 220 may be formed of an organic material such as copper phthalocyanine (CuPc), N,N'-Di(naphthalene-1-yl)-N,N'-diphenyl-benzidine (NPB), tris-8-hydroxyquinoline aluminum (Alq3), or the like. These layers may be formed, for example, using a vacuum deposition method.

When the intermediate layer 220 is formed of a high molecular weight material, the intermediate layer 200 it may be preferable to have a structure in which an HTL and an EML are stacked. The HTL may be formed of PEDOT, and the EML may be formed of Poly-Phenylenevinylene (PPV)-family and Polyfluorene-family high molecular weight materials using a screen printing method, an inkjet printing method, or the like. However, the intermediate layer 220 is not limited to this structure, and may have various other structures.

The counter electrode 230 may be disposed on the intermediate layer 220, over the display area 100 as illustrated in FIG. 2. The counter electrode 230 extends outside the display area 100 and contacts the electrode power supply line 190 disposed outside the display area 100 to receive power from the electrode power supply line 190. That is, the counter electrode 230 extends outside the display area 100 of the substrate 110 over the third insulating layer 183 and the electrode power supply line 190 which is exposed by the third insulating layer 183.

The counter electrode 230 may be a transparent or reflective electrode. If the counter electrode 230 is a transparent electrode, the counter electrode 230 may include a layer formed of a metal having a low work function, i.e., Li, Ca, LiF/Ca, LiF/Al, Al, Ag, Mg, or a combination thereof, and a transparent conductive layer formed of ITO, IZO, ZnO, or $In_2O_3$. If the counter electrode 230 is a reflective electrode, the counter electrode 230 may be formed of Li, Ca, LiF/Ca, LiF/Al, Al, Ag, Mg, or a combination thereof. However, the counter electrode 230 is not limited to these structures and materials, and thus, may be modified into various forms.

FIG. 3 is a schematic cross-sectional view for describing a process of manufacturing the organic light emitting display apparatus according to one embodiment. FIG. 3 illustrates the organic light emitting display apparatus before forming the intermediate layer 220 and the counter electrode 230.

As described above, the third insulating layer 183 has an opening exposing at least a part of the pixel electrode 210 and an opening exposing at least a part of the electrode power supply line 190, and covers the auxiliary conductive layer 190*a*. In an embodiment of a process to form the third insulating layer 183, an insulating layer is formed on the entire surface of the substrate 110. Then, exposing, developing, and etching processes are performed on the insulating layer using photoresist. Finally, a washing process is performed on the insulating layer using deionized (DI) water. In these manufacturing steps, since the auxiliary conductive layer 190*a* is covered by the third insulating layer 183, the electrode power supply line 190, the terminal unit 192, and the auxiliary conductive layer 190*a* are not damaged.

Figure 4:
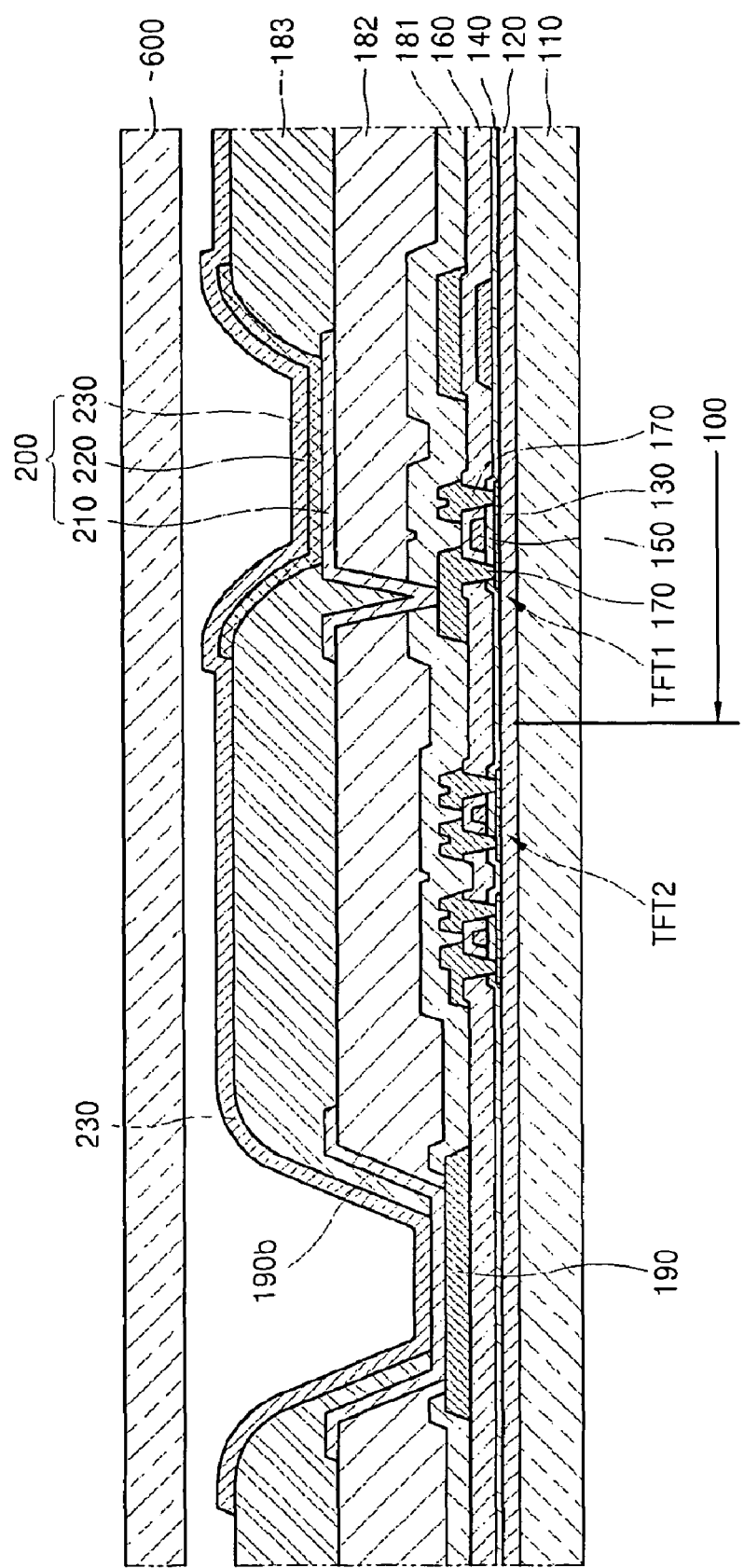
FIG. 4 is a schematic cross-sectional view of a portion of an organic light emitting display apparatus.
Figure 5:
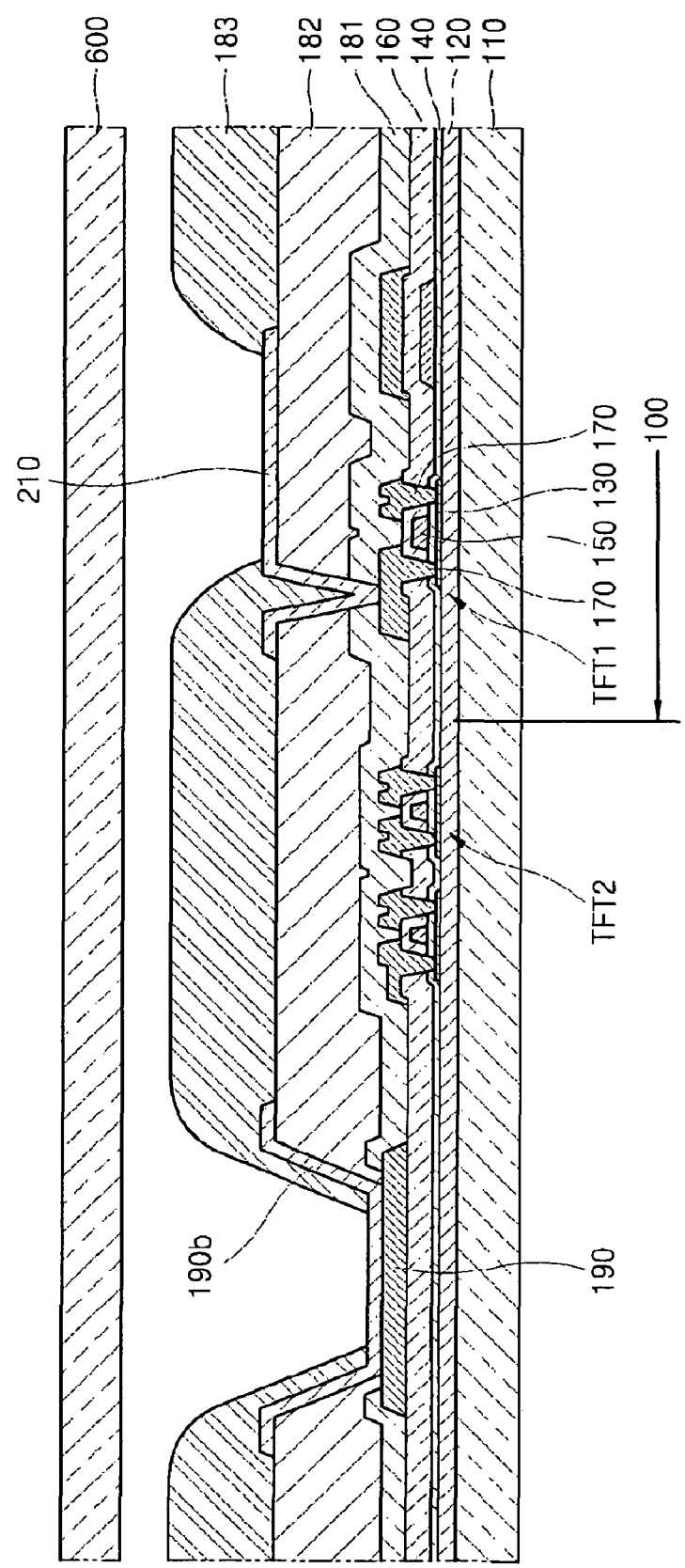
FIG. 5 is a schematic cross-sectional view for describing a process of manufacturing the organic light emitting display apparatus of FIG. 4.

FIG. 4 is a schematic cross-sectional view of an embodiment of a portion of an organic light emitting display apparatus. FIG. 5 is a schematic cross-sectional view for describing a process of manufacturing the organic light emitting display apparatus of FIG. 4. Referring to FIGS. 4 and 5, an auxiliary conductive layer 190*b* is disposed on an electrode power supply line 190, and a third insulating layer 183 is formed so as to expose the auxiliary conductive layer 190*b*. A counter electrode 230 contacts the auxiliary conductive layer 190*b* so as to be electrically connected to the electrode power supply line 190 via the auxiliary conductive layer 190*b*.

In the organic light emitting display apparatus illustrated in FIGS. 4 and 5, the auxiliary conductive layer 190*b* is exposed in a process of forming the third insulating layer 183 and the subsequent processes. In this case, since a terminal unit connected to the electrode power supply line 190 is exposed outside the third insulating layer 183, the auxiliary conductive layer 190*b* or the terminal unit may be damaged in the process of forming the third insulating layer 183 and the subsequent processes.

In more detail, a developing process of the third insulating layer 183 using photoresist and stripping and/or washing processes of the photoresist are performed using a wet process. In the above processes, the auxiliary conductive layer 190*b* and the terminal unit, which are respectively formed of different materials, are exposed by an alkali solution used in the wet process. At this time, a potential difference is generated between the auxiliary conductive layer 190b and the terminal unit due to a galvanic phenomenon, so that at least one of the auxiliary conductive layer 190b and the terminal unit is greatly damaged. For example, if a pixel electrode 210 includes a layer formed of ITO, and the auxiliary conductive layer 190b is formed of the same material as that of the pixel electrode 210 and thus also includes a layer formed of ITO, the terminal unit includes a layer formed of Al and the electrode power supply line 190 is formed of the same material as that of the terminal unit and thus also includes a layer formed of Al, the layer formed of Al is oxidized and the layer formed of ITO is reduced, thereby damaging the layer formed of Al. As a result, resistance of the Al layer is sharply increased due to oxidization of the Al layer, thereby causing defect of the organic light emitting display apparatus.

However, in the organic light emitting display apparatus according to the embodiment as shown in FIGS. 1 through 3, since the auxiliary conductive layer 190a is covered by the third insulating layer 183 in the process of forming the third insulating layer 183 and the subsequent processes, the above-described problem does not occur. In more detail, even though the electrode power supply line 190 and the terminal unit 192 are exposed by the third insulating layer 183 in the process of forming the third insulating layer 183 and the subsequent processes, since the electrode power supply line 190 and the terminal unit 192 are formed of the same material, a galvanic phenomenon does not occur between the electrode power supply line 190 and the terminal unit 192. That is because the galvanic phenomenon occurs between different materials. In particular, in the organic light emitting display apparatus, when the pixel electrode 210 includes a layer formed of ITO, the auxiliary conductive layer 190a may also include a layer formed of ITO, and the terminal unit 192 may include the same material as that of the electrode power supply line 190 and include a layer formed of Al. The problem in which the layer formed of Al is oxidized or the layer formed of ITO is reduced can be prevented. Furthermore, when the pixel electrode 210 is formed as a multi-layer structure having an uppermost layer formed of ITO, the auxiliary conductive layer 190a may be formed as a multi-layer structure also having an uppermost layer formed of ITO. In this case, the layer formed of ITO is not exposed outside the third insulating layer 183.

Referring to FIGS. 4 and 5, since the electrode power supply line 190 and the terminal unit are connected to each other and the auxiliary conductive layer 190b contacts the electrode power supply line 190; a galvanic phenomenon can occur between the terminal unit and the auxiliary conductive layer 190b. Referring to FIGS. 1 through 3, in the organic light emitting display apparatus, the pixel electrode 210 is exposed by the third insulating layer 183; however, the pixel electrode 210 does not directly contact the terminal unit 192 or the electrode power supply line 190. Accordingly, a galvanic phenomenon does not occur between the pixel electrode 210 and the terminal unit 192 or the electrode power supply line 190.

The organic light emitting display apparatus is not limited to these specific exemplary embodiments. For example, the first insulating layer 181 operating as a passivation layer and the second insulating layer 182 operating as a planarizing layer are not necessarily formed separately and may be integrally formed as one body.

In the embodiment illustrated in FIGS. 1 to 3, the electrode power supply line 190 is exposed by the third insulating layer 183, the terminal unit 192 extending from the electrode power supply line 190 is exposed by the third insulating layer 183, and the auxiliary conductive layer 190a is covered by the third insulating layer 183. In this embodiment, because the electrode power supply line 190 and the terminal unit 192 are respectively formed of the same material, and the auxiliary conductive layer 190a, formed of different material, is covered by the third insulating layer 183 and is therefore not exposed outside the third insulating layer 183, the electrode power supply line 190, the auxiliary conductive layer 190a, or the terminal unit 192 is prevented from being damaged in a process of patterning the third insulating layer 183 and the subsequent processes. However, the present invention is not limited thereto.

For example, in an organic light emitting display apparatus including a substrate, a conductive layer disposed on the substrate, an insulating layer covering a part of the conductive layer so as to expose the conductive layer, and a terminal unit extended from the conductive layer toward an edge of the substrate, when the conductive layer and the terminal unit are respectively formed of different material, a galvanic phenomenon may occur between the conductive layer and the terminal unit in a process of patterning the insulating layer and the subsequent processes. Accordingly, the conductive layer, which is exposed by the insulating layer, and the terminal unit are formed of the same material so as to prevent a galvanic phenomenon. Also, an auxiliary conductive layer may be disposed at a side of the conductive layer so as to contact the conductive layer. In this case, the auxiliary conductive layer may be formed of a different material from the conductive layer or the terminal unit. When the auxiliary conductive layer is exposed outside the insulating layer, a galvanic phenomenon may occur between the auxiliary conductive layer and the conductive layer or between the auxiliary conductive layer and the terminal unit. Accordingly, the auxiliary conductive layer may be covered by the insulating layer so as to prevent the galvanic phenomenon from occurring between the auxiliary conductive layer and the conductive layer or between the auxiliary conductive layer and the terminal unit.

In particular, when the terminal unit and the conductive layer are simultaneously formed together and have the same structure; the conductive layer may include a layer formed of Al; and the auxiliary conductive layer may include a layer formed of ITO, the effect of the present invention is remarkable. The present invention can be applied to any case in which the auxiliary conductive layer and the conductive layer are respectively formed of different materials.

According to the organic light emitting display apparatus of the present invention, process yield can be dramatically increased by preventing corrosion during a manufacturing process thereof.

While the present invention has been particularly shown and described with reference to exemplary embodiments thereof, it will be understood by one of ordinary skill in the art that various changes in form and details may be made therein without departing from the spirit and scope of the present invention.

What is claimed is:
1. An organic light emitting display apparatus comprising:
   a substrate having a display area;
   a thin film transistor (TFT) disposed inside the display area of the substrate;
   an electrode power supply line disposed outside the display area of the substrate;
   a pixel electrode disposed inside the display area of the substrate and electrically connected to the thin film transistor;

an auxiliary conductive layer contacting the electrode power supply line;
a pixel defining layer exposing the pixel electrode, completely covering the auxiliary conductive layer, and exposing the electrode power supply line;
an intermediate layer disposed on the pixel electrode and including an emitting layer; and
a counter electrode disposed on the intermediate layer and extending outside the display area of the substrate to contact the electrode power supply line.

2. The organic light emitting display apparatus of claim 1, wherein the auxiliary conductive layer is disposed outside the display area of the substrate.

3. The organic light emitting display apparatus of claim 1, wherein the auxiliary conductive layer is formed of the same material as that of the pixel electrode.

4. The organic light emitting display apparatus of claim 3, wherein the pixel electrode comprises a layer formed of ITO.

5. The organic light emitting display apparatus of claim 4, wherein the pixel electrode comprises a multi-layer structure having an uppermost layer formed of ITO.

6. The organic light emitting display apparatus of claim 3, wherein the auxiliary conductive layer is formed in the same processing steps as the pixel electrode.

7. The organic light emitting display apparatus of claim 1, wherein a part of the auxiliary conductive layer is disposed on the same layer as the pixel electrode.

8. The organic light emitting display apparatus of claim 1, wherein the pixel defining layer is disposed over the display area of the substrate and outside the display area.

9. The organic light emitting display apparatus of claim 1, further comprising a planarizing layer covering the thin film transistor and an edge of the electrode power supply line,
wherein the pixel electrode is disposed on the planarizing layer, the auxiliary conductive layer is disposed over the planarizing layer and the electrode power supply line, and the pixel defining layer is disposed so as to cover the planarizing layer.

10. The organic light emitting display apparatus of claim 1, wherein the counter electrode extends outside the display area of the substrate over the electrode power supply line exposed by the pixel defining layer.

11. The organic light emitting display apparatus of claim 1, wherein the thin film transistor comprises source and drain electrodes and a gate electrode, and the electrode power supply line is formed of the same material as that of the source and drain electrodes.

12. The organic light emitting display apparatus of claim 11, wherein the electrode power supply line comprises a layer formed of aluminum.

13. The organic light emitting display apparatus of claim 11, wherein the electrode power supply line is formed in the same processing steps as the source and drain electrodes.

14. The organic light emitting display apparatus of claim 11, wherein the electrode power supply line is disposed on the same layer as the source and drain electrodes.

15. The organic light emitting display apparatus of claim 1, further comprising a terminal unit extending from the electrode power supply line toward an edge of the substrate.

16. The organic light emitting display apparatus of claim 15, wherein the terminal unit is formed of the same material as that of the electrode power supply line.

17. The organic light emitting display apparatus of claim 16, wherein the terminal unit comprises a layer formed of aluminum.

18. The organic light emitting display apparatus of claim 16, wherein the terminal unit and the electrode power supply line are formed in the same processing steps.

19. The organic light emitting display apparatus of claim 16, wherein the terminal unit and the auxiliary conductive layer are respectively formed of different materials.

* * * * *